United States Patent [19]

Gibbons et al.

[11] Patent Number: 4,734,582

[45] Date of Patent: Mar. 29, 1988

[54] INTEGRATION TIME CONTROL FOR A RADIATION SENSITIVE CHARGE INJECTION DEVICE

[75] Inventors: Martin D. Gibbons, Camillus; Samuel C. Wang, Manlius; Kenneth J. Fuhr, Utica; Marshall K. Quick, New Hartford, all of N.Y.

[73] Assignee: General Electric Company, Syracuse, N.Y.

[21] Appl. No.: 938,156

[22] Filed: Dec. 4, 1986

[51] Int. Cl.[4] .............................................. H01L 31/00
[52] U.S. Cl. .................................. 250/332; 250/578; 358/113
[58] Field of Search ............... 250/370 R, 370 G, 332, 250/349, 338 SE, 578; 358/113, 213.31, 213.29, 213.27, 213.11, 213.15, 213.16

[56] References Cited

U.S. PATENT DOCUMENTS

| | | | |
|---|---|---|---|
| 4,316,221 | 2/1982 | Swab | 358/213.16 |
| 4,399,464 | 8/1983 | Hix et al. | 358/113 |
| 4,589,024 | 5/1986 | Koch et al. | 358/213.31 |
| 4,609,825 | 9/1986 | Berger et al. | 358/213.29 |

Primary Examiner—Carolyn E. Fields
Assistant Examiner—John A. Miller
Attorney, Agent, or Firm—Richard V. Lang; Carl W. Baker; Fred Jacob

[57] ABSTRACT

A novel readout circuit for a charge injection device is disclosed permitting selection of the integration time to optimize performance. A primary application of the invention is to IR sensing in which performance is required at both low and very high levels of radiation. The readout circuit, in one practical configuration, utilizes a dump pulse recurring at the interval required to scan all elements, in advance of the read pulse also recurring at the scanning interval. The integration time may be adjusted in multiples of the readout period for a single element up to the frame scanning interval, or in approximate fractions of the readout period for a single element, or, at the limit, in a fraction of a microsecond.

5 Claims, 6 Drawing Figures

INTEGRATION TIME CONTROL FOR A RADIATION SENSITIVE CHARGE INJECTION DEVICE

BACKGROUND OF THE INVENTION

1. Field of the Invention

The invention relates to charge injection devices (CIDs) for sensing and imaging radiation, the CIDs having either linear or two dimensional arrays of sensing sites. More particularly, the invention relates to a novel readout circuit in which the integration time may be controlled to suit the application or radiation conditions. The invention has particular application to IR sensing in which the CID array may be required to respond to both low and very high level background and target radiation with minimal degradation in performance.

2. Prior Art

Radiation integrating detectors usually operate with an integration time such that background and dark current carriers fill a small fraction of the saturated charge capacity, leaving a large fraction of the capacity for target signal. However, some scenes have large backgrounds such as sunlit clouds, or have extended bright targets such as would occur at the end game of a missile flight. These can then cause saturation problems.

Previous attempts to increase the charge storage capacity of InSb CIDs, which are of application to IR sensing, have had only limited success. The saturated charge of the site is given by $Qsat = (KEo/t) AV_I$ where K is the dielectric constant of the insulator
Eo is the permittivity of free space
t is the insulator thickness
A is the gate area
$V_I$ is the effective readout or "Inject" voltage.

Attempts to increase the Qsat by the use of thinner oxide or an increased injection voltage have not been successful because of breakdown effects. Increasing the Qsat by increasing gate area has had moderate success in scanned arrays. In that case, the gate area can be extended in the scan direction by addition of opaque storage gate area, keeping the optical aperture of the site fixed.

Another method of increasing Qsat includes ramping of the bias levels during integration so as to cause some background charge to replace the bias charge. This method has limited application to cases when the dynamic range within the scene is not too large.

Another method of increasing the Qsat is the use of buffer gates as a guard ring to lessen breakdown effects. This method can increase Qsat by a factor of two.

SUMMARY OF THE INVENTION

Accordingly, it is an object of the present invention to provide an improved readout circuit in a charge injection device.

It is another object of the present invention to provide in a charge injection device, a readout circuit in which high intensity radiation may be sensed with minimal degradation in performance.

It is still another object of the present invention to provide in a charge injection device, an improved readout circuit having means to control the charge integration time to optimize performance.

It is a further object of the invention to provide an improved IR sensing linear or two dimensional array in which the integration time may be selected to suit the requirements.

These and other objects of the invention are achieved in a radiation sensitive, charge injection device (CID), in which the integration time in controlled.

Integration timing is achieved in a combination comprising an array and a novel readout circuit. The array comprises a substrate of radiation sensitive semiconductor material supporting an interfacing layer of insulating material and on which are arranged an m fold series of pixel sites forming potential wells storing optically induced charges, the charges continuing to integrate as radiation impinges thereon, each site having a conductive gate which is selectively connected to a common output line for readout.

The readout circuit connected to a video output line comprises a source of dump potential suitable for injecting signal charge into the substrate, and m controllable dump switches ($DS_{l-m}$), each dump switch selectively coupling the dump potential to an associated site, a source of read potential suitable for injecting signal charge into the substrate and producing an electrical signal at the output line which is sensed for readout and m controllable read switches ($TS_{l-m}$), each read switch selectively coupling the read potential to an associated site, and means to establish equal charge integration times for all m sites.

The integration timing means comprise a first m stage shift register for propagating a given logical state (normally a logical high) at a given clock rate, the propagation starting in response to a start dump pulse and causing each site to be sequentially dumped when the logical high occurs. A second m stage shift register is also included for propagating a logical high at the clock rate, the propagation starting in response to a start read pulse and causing each site to be sequentially read out when the logical high occurs. The dump pulses and the read pulses recur at the scanning interval, the read pulses being delayed in relation to the dump pulses by a predetermined portion of the scanning interval to establish a desired and equal integration time for each site.

The dump and read approach described above permits adjustment of the integration time in intervals equal to multiples of the period for reading out a single site.

In a 64 element array, assuming that the "dump" pulse is applied at the first element, the read pulse may be applied at any one of the periods assigned to readout the succeeding 2–64 elements.

In the event that very short integration times are desired, means in accordance with a further variation of the invention and disclosed for dumping in the same pixel period as the readout occurs, allowing a selection of an integration time of less than a microsecond to the several microseconds corresponding to have the readout time for an element.

In accordance with a further variation of the invention, means are described for reducing the integration time, at a sacrifice in resolution, by simple fractions typically one-half and one-quarter.

BRIEF DESCRIPTION OF THE DRAWINGS

The inventive and distinctive features of the invention are set forth in the claims of the present application. The invention itself, however, together with further objects and advantages thereof may best be understood by reference to the following description and accompanying drawings, in which:

DESCRIPTION OF THE PREFERRED EMBODIMENT

Figure 1:
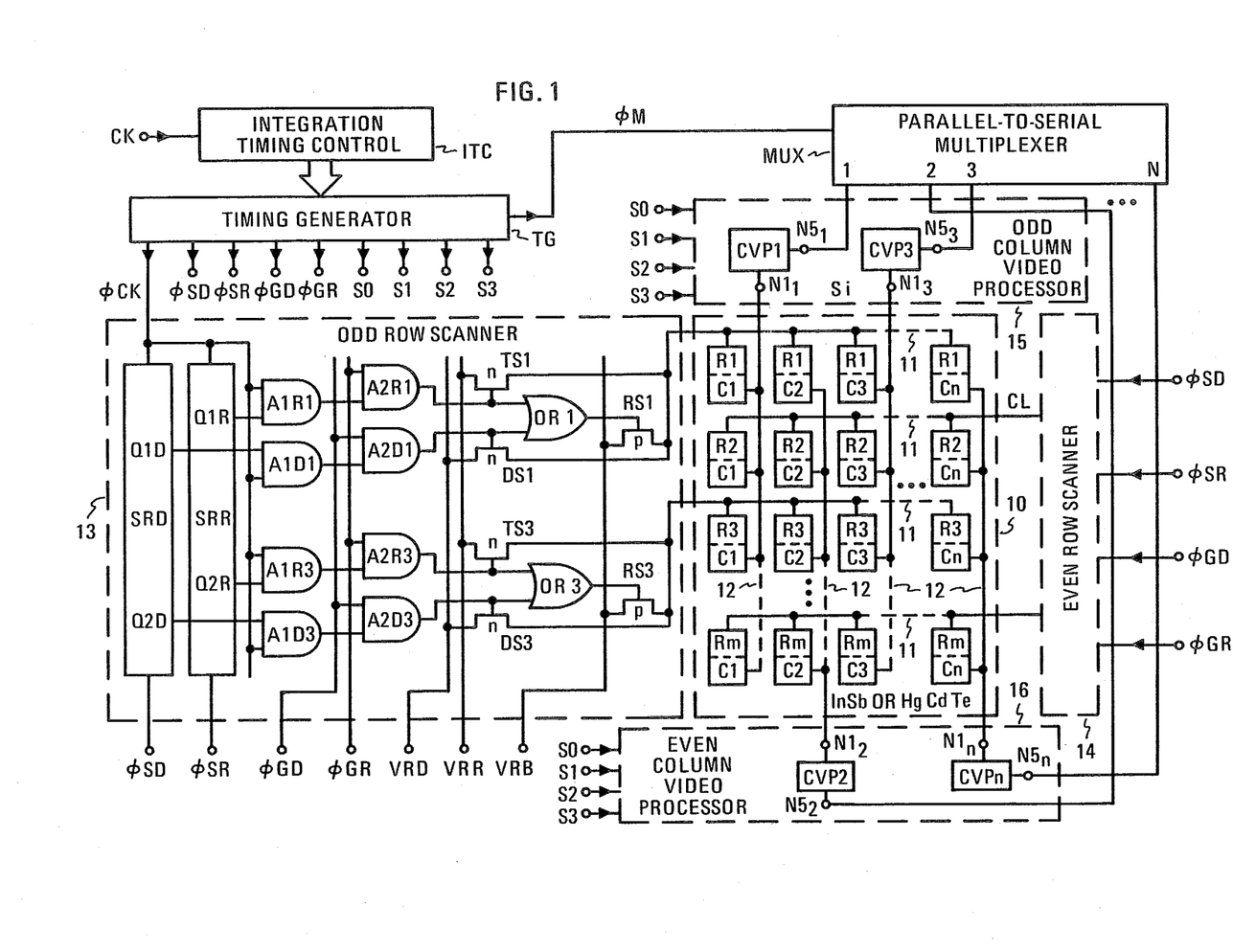
FIG. 1 is an illustration of a first embodiment of the invention, combining a radiation sensing charge injection device (CID) comprising a two dimensional array of dual gate sensing sites on a semiconducting substrate and a novel readout circuit in which the integration time may be selected to suit the application and incident radiation conditions.

Referring now to FIG. 1, a charge injection device (CID) for infrared (IR) imaging is shown. The CID comprises an IR area sensor array of dual gate charge storage sites combined with a novel readout circuit. In the novel readout circuit, the charge integration period may be adjusted to avoid saturation due to high intensity background and target radiation.

The sensor array 10 comprises a substrate of IR sensitive semiconductor material, typically Indium antimonide (InSb) or mercury cadmium telluride (HgCdTe) supporting a layer of insulating material typically silicon dioxide ($SiO_2$) or zinc sulfide (ZnS). For non IR sensing, the substrate material can be Silicon (Si). A conductive row gate and a conductive column gate are coupled to form a pixel site, each gate defining a capacitive cell including the underlying portions of the insulating layer and of the semiconductor substrate. In the FIG. 1 illustration, the array consists of m rows and n columns of dual gate sites. Each site thus defines a common region consisting of two contiguous capacitive cells in which optically induced electron-hole pairs may be created by photons, and between and within which the charges are free to move. Customarily, the charges (holes) accumulate at the interface between the insulating material and the semiconductor material, and flow freely from the column cell to the row cell and vice versa, normally under the influence of voltages applied to the row and column gates. All the row gates in one line are interconnected by a conductive row line 11, and all the column gates in one column are interconnected by a conductive column line 12. Accordingly, m row lines and n column lines are provided for connection of the array to the readout circuit.

The readout circuit shown in FIG. 1 may be partitioned into four means (13,14; 15,16; MUX and TG). The first means, 13,14 which provide for biasing the row gates and for sequential row dumping and reading, is subdivided into two parts, an odd row scanner 13 and an even row scanner 14 connected to the row lines 11 of the sensor array. The second means 15,16, which provides for biasing the column gates and derives the video information from the column gates, is subdivided into an odd column video processor 15 and an even column video processor 16. In practice the components 14, 15, 16, and 17 are four separate integrated circuits arranged on a common substrate about the perimeter of the sensor array 10. The outputs of the column video processors (15,16) are then sampled by the parallel to serial multiplexer (MUX) which combines the parallel streams of column data into a form suitable for utilization. Typically, the column data is consolidated into 1 to 4 serial data streams. The fourth means (TG) times the operation of the CID including the means 13,14; 15,16; and the MUX.

The odd row scanner 13, includes a terminal for connection to a source of row bias potentials (VRB) and m controllable row bias reset switches ($RS_{l-m}$); a terminal for connection to a source (VRD) of row dump potentials and m controllable row dump switches ($DS_{l-m}$); a terminal for connection to a source of row read potentials (VRR) and m controllable row read switches ($TS_{l-m}$); a first shift register (SRD) for sequential control of odd row dump potentials; a second shift register (SRR) for sequential control of odd row read potentials; and logic means associated with each output stage of the odd dump and read shift registers which for row 1 consists of four AND gates ($A1D_1$, $A2D_1$, $A1R_1$, $A2R_1$) and an OR gate (OR1) for controlling the application of dump and read signals and removal of row bias. In FIG. 1, the odd row scanner is shown connected to the first and third row lines 11 of the sensor array, it being understood that the scanner 13 will in fact be connected to half the total number of rows (e.g. 64 in a 128×128 array).

The even row scanner 14, whose logical design is not shown in FIG. 1, has similar terminals for connection to the bias, dump and read potentials, similar switches, registers and logic for controlling the application of dump and read signals and removal of row bias in relation to the even rows.

Figure 2:
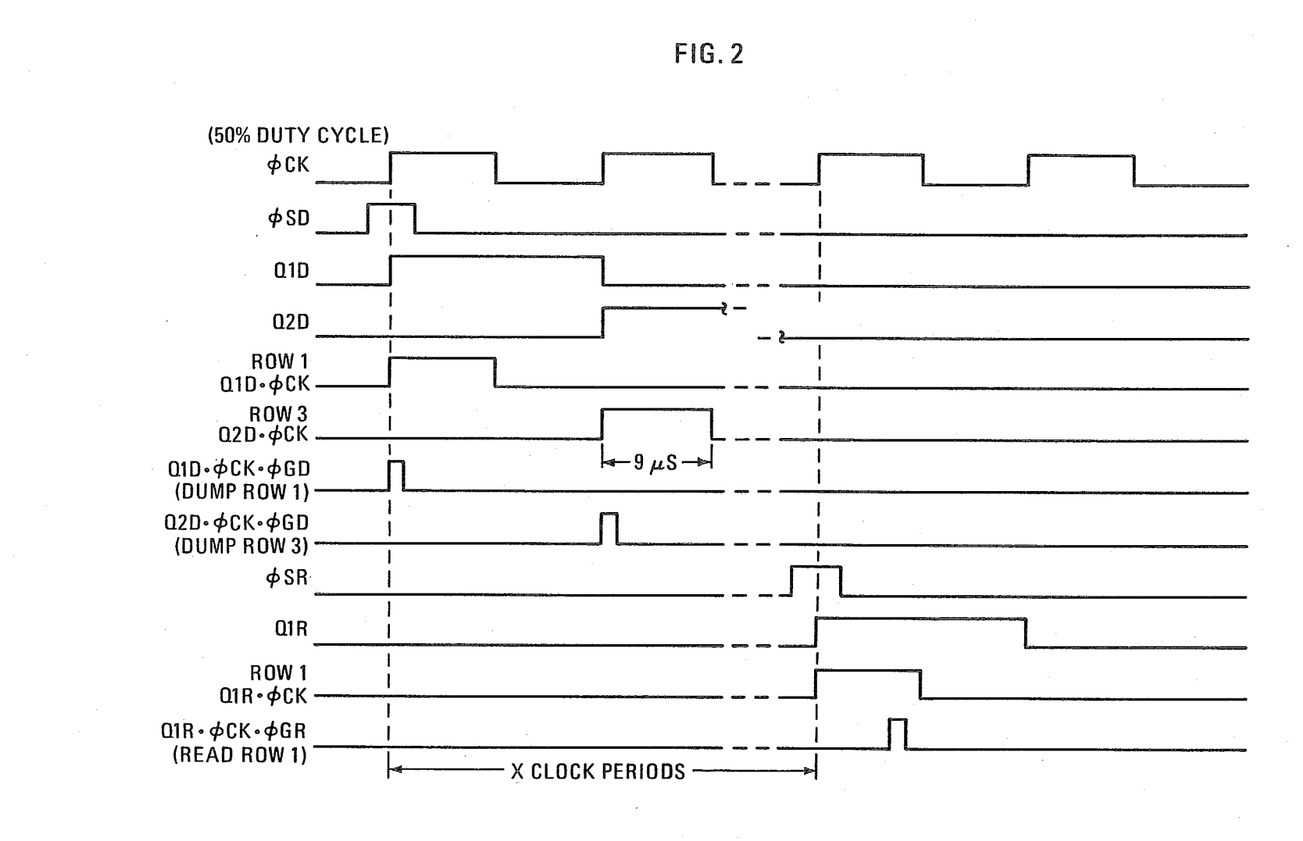
FIG. 2 illustrates the waveforms applicable to the odd and even row scanners of the readout circuit of the FIG. 1 embodiment.

FIG. 2 shows the waveforms operative in the odd row scanner 13 with the waveforms being interrupted at a common time coordinate between Dump operation to the left and Read operation to the right. In the illustration the clock is assumed to continue at a constant rate. The Read operation of the jth pixel follows the dump operation by "X" clock periods, the waveforms being broken to designate the passage of sufficient time to allow this to occur. The quantity "X" is set by operator choice.

The components of the odd row scanner 13 are interconnected and operate as follows. Referring to FIGS. 1 and 2, the odd row shift register (SRD), which controls dumping, is in turn controlled by the clock ($\phi CK$) (the uppermost waveform) and the start dump pulse ($\phi SD$) (second waveform from the top), which are supplied from the timing generator (TG). The shift register (SRR), which controls odd row reading, is in turn controlled by the clock ($\phi CK$) and the start read pulse ($\phi SR$) (the fourth waveform from the bottom). The clock waveform has a period of 18 microseconds and a 50% duty cycle, with the next odd row being selected at the next clock cycle and the even rows being selected at the half clock cycle. The pulses ($\phi SD$) and $\phi SR$ are of shorter duration than the clocking pulse, typically four microseconds and embrace the beginning of the clocking pulse. The pulse $\phi SD$ defines the start of the odd row scanning sequence.

The shift register (SRD) produces an output waveform Q1D (the third waveform from the top in FIG. 2) at the first output tap. That output is designed to control dumping of the first row of the sensor array. The waveform Q1D commences at the beginning of the first clock pulse, and lasts for one clock period (18 microseconds). The Q1D output is coupled to one input of the AND gate (A1D$_1$) and is ANDed with the clock pulse to produce the waveform (QID.$\phi$CK) (the fifth waveform in FIG. 2) which has a duration of 9 microseconds corresponding to the logical high of the clock waveform. The output of the AND gate A1D$_1$ is next coupled to one input of the AND gate A2D$_1$ where it is ANDed with the dump gating pulse $\phi$GD (not illustrated) which is a short duration (1 microsecond) pulse beginning with the clocking pulse and repeating at the clocking pulse period.

The output of the AND gate A2D$_1$ is connected to the gate of the n channel dump switch (DS$_1$) and to the OR gate OR$_1$ for the first row of the scanner array. The principal electrodes of the dump switch (DS$_1$) are connected between the terminal for application of dump potentials (V$_{RD}$) and the first row of the scanner. The output of the OR gate OR$_1$ is connected to the gate of the bias switch RS$_1$. The principal electrodes of the p channel bias switch RS$_1$ are connected between the terminal for application of bias potentials (VRB) and the first row of the scanner.

When the output of gate A2D$_1$ goes high, the output of the gate OR$_1$ goes high, turning off the p channel switch RS$_1$ and disconnecting the bias from the first row, and turning on the n channel switch DS$_1$ connecting dump potential to the first row line during the dump pulse (Q1D.$\phi$CK.$\phi$GD).

A similar sequence to that producing dump operation occurs X clock periods later in relation to the row read circuitry. As earlier noted, the shift register (SRR) which controls odd row reading, is controlled by the clock $\phi$CK and the start read pulse $\phi$SR.

The shift register (SRR) produces an output waveform Q1R (the third waveform from the bottom in FIG. 2) at the first output tap. That output is designed to control readout of the first row of the sensor array. The waveform Q1R commences at the beginning of the Xth clock pulse, and lasts for one clock period (18 microseconds). The Q1R output is coupled to one input of the AND gate (A1R$_1$) and is ANDed with the clock pulse to produce the waveform (Q1R.$\phi$CK) (the second waveform from the bottom in FIG. 2) which has a duration of 9 microseconds corresponding to the logical high of the clock waveform. The output of the AND gate A1R$_1$ is next coupled to one input of the AND gate A2R$_1$ where it is ANDed with the read gate pulse $\phi$GR (not illustrated) which is a short duration (1 microsecond) pulse occurring with the high of the clocking pulse and repeating at the clocking pulse period.

The output of the AND gate A2R1 is connected to the gate of the n channel read switch (TS$_1$) and to the OR gate OR1 for the first row of scanner array. The principal electrodes of the n channel read switch (TS$_1$) are connected between the terminal for application of read potentials (VRD) and the first row of the scanner. As earlier noted, the output of the OR gate OR$_1$ is connected to the gate of the p channel of the bias switch RS$_1$ for controlled application of bias potentials (VRB) to the first row of the scanner.

When the output of A2R$_1$ goes high, the output of the OR gate OR$_1$ goes high, turning off the p channel switch RS$_1$ and disconnecting the bias from the first row, and turning on the n channel switch TS$_1$ connecting the read potential to the first row line during the read pulse (Q1R.$\phi$CK.$\phi$GR).

The odd row scanner 13 performs the dumping and reading function for all of the odd rows of the sensor array. As just described in connection with several of the FIG. 4 waveforms, the first row is dumped upon the joint occurrence of the dump pulse, the clocking pulse, and the dump gating pulse. The dumping operation is repeated for the third row (the second odd row) one clock period later and again repeated for the fifth row (the third odd row) one clock period later. The dumping operation of the odd row scanner thus continues until all odd rows have been dumped.

The even row scanner, whose logical design is not shown, is of a similar design to that of the odd row scanner, the principal difference being that its operations are designed to start with the second half (the logical zero state) of the clock pulse rather than the first half (the logical one state) with which the odd row scanner starts.

Accordingly, dump operation of the even row scanner 14 is timed to start at the beginning of the 9 microsecond logical zero of the clock waveform. (The period may be longer or shorter, 5 microseconds being typical for a 128 × 128 sensor array.) Thus the dump operation of the second row (the first even row) occurs 9 microseconds (one-half clock period) after dump operation of the first row; and the dump operation of the fourth row occurs 18 microseconds after the dump operation of the second row and 27 microseconds (two-and-a-half clock periods) after dump operation of the first row. The dumping operation of the even row scanner thus continues once per clock period at the beginning of the second half of the clock period until all even rows have been dumped.

Meanwhile the read operation of the even row scanners continues in a manner like the dump operation, but delayed from the dump operation by X clock periods (as with the odd row scanners). Thus the read operation of the second row (the first even row) occurs 9 microseconds (one half clock period) after read operation of the first row, the later occurring at the coincidence of the waveform QR, $\phi$CK and $\phi$GR. The read operation of the second row occurs X clock periods after dump operation of the second row. The read operation of the fourth row occurs X clock periods after dump operation of the fourth row. The reading operation of the even row scanner thus continues once per clock period at the setting delayed from dumping by X clock periods until all even rows have been dumped.

The column scanners 15,16, as discussed, perform the read operation of each row X clock periods after dump, creating an integration time for the sensor elements of X clock periods. A low setting, where X equals one clock period corresponds to a very strong signal where a near minimum integration time is desired. (As will be seen, one could shorten the integration period until it is less than a clock period for a stronger signal.) Should the signal be weak, one might delay readout until the last clock period before the next dump, or omit it altogether. The latter option is the conventional setting in which the integration time corresponds to the time between successive readouts, and is thus made equal to the time allowed for scanning the array. The dump signal in this case is not needed since the prior readout clears the site, to start the next integration period. If the scanning is subdivided as shown, the longest integration time in the FIG. 1 embodiment is equal to one half the number of row sites times the clock period.

The readout circuit further comprises the odd and even column video processors, n altogether, each connected to a column line 12 for deriving parallel information as each row is selected and a parallel to serial multiplexer (MUX) for forming one or more data streams suitable for further use.

Figure 3:
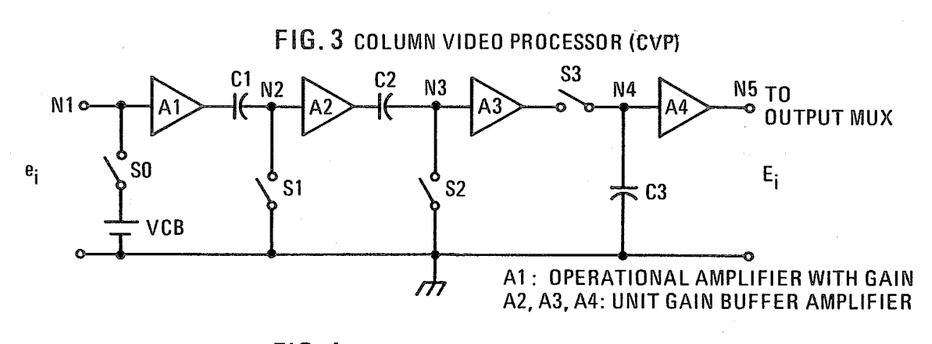
FIG. 3 illustrates a single column video processor, which is one of n like video processors, used in the odd and even column video processors of the FIG. 1 embodiment.

Each video processor ($CVP_j$), as shown in FIG. 3 comprises four amplifiers ($A1_j$–$A4_j$), three capacitors ($C1_j$–$C3_j$), four switches ($S0_j$–$S03_j$), and a source of column bias potentials (VCB). Five nodes ($N1_j$, $N2_j$, $N3_j$, $N4_j$, $N5_j$), useful in circuit description, are present in each video processor: the node ($N1_j$) representing the input and the node ($N5_j$) representing the output, and the nodes ($N2_j$ and $N3_j$, $N4_j$) representing internal nodes. Each input node ($N1_j$) of the n column processors is coupled to a correspondingly numbered column (12) of the sensor array 10. Each output node ($N5_j$) of the n column processors is coupled to a correspondingly numbered input of the parallel to serial multiplexer.

The internal connections of each column video processor are as follows. The input node ($N1_j$) is connected to the input of a high gain amplifier ($A1_j$). The input node is also connected via the column bias reset switch ($S0_j$) and the source of column bias potential (VCB) to ground. The switch ($S0_j$) and source (VCB) act to reset the node ($N1_j$) to bias potential. The output of amplifier ($A1_j$) is connected via capacitor ($C1_j$) to the node ($N2_j$) at the input of a buffer amplifier ($A2_j$), typically of unitary gain. The node ($N2_j$) is connected to ground by the switch ($S1_j$) which in cooperation with the capacitor ($C1_j$) provides for dc referencing of the signal sample. The output of the amplifier ($A2_j$) is connected via the capacitor ($C2_j$) to the node ($N3_j$) at the input of the buffer amplifier ($A3_j$), also typically of unitary gain. The node ($N3_j$) is connected to ground via the switch ($S2_j$) which in cooperation with the capacitor ($C2_j$) provides for subtractive error correction.

Continuing with the description of a column video processor; the output of the buffer amplifier ($A3_j$) is connected via the switch ($S3_j$) to the node ($N4_j$) at the input of the output buffer amplifier ($A4_j$), also typically of unitary gain. The capacitor ($C3_j$) is connected between the node ($N4_j$) and ground. Switch ($S3_j$) in combination with the capacitor ($C3_j$) provides for sampling and holding the signal, dc referenced, and corrected for subtractive error. The output of the buffer amplifier ($A4_j$) is then supplied to the jth parallel input of the parallel-to-serial multiplexer (MUX) where it is combined with the outputs of the other buffer amplifiers of the other column video processors to form a signal suitable for application to the display apparatus.

The readout circuit is completed by a timing generator (TG) which has outputs for timing the operation of the odd and even row scanners as has been described, the operation of the odd and even column video processors, and the multiplexer (MUX). The quantity X—the integration time is controlled by the integration timing control coupled to the timing generator.

The readout circuit scans the InSb imager 10 in accordance with a method known as sequential row injection (SRI). The SRI method is known to have certain limitations of which the most significant is the occurrence of a subtractive error which reduces sensitivity. The scanning of the imager in the present FIG. 3 embodiment generally follows the sequence of site selection described in FIG. 9 of U.S. Pat. No. 4,316,221 of John Swab, filed Aug. 5, 1980 and entitled "Apparatus for Sequential Row Injection Readout of CID Imagers." The subtractive error correction feature of the FIG. 3 embodiment is the subject matter of copending application Ser. No. 919,464 of Messrs. Wang, Gibbons, Winn, and Danielson, assigned to the Assignee of the present application.

The scanning sequence begins with the generation by the timing generator (TG) of an initial dumping pulse (phi SD) and of a later read out phase phi SR, coupled respectively to the odd shift registers SDR and SRR (and with comparable pulses applied to the even shift registers in the even row scanner 14). The shift registers then proceed to count in sequence at the clocking rate until all m rows have been dumped and read out.

In accordance with the invention, all sites on the array under the row and column gates are maintained at a suitable state to integrate photon induced charges as the scanning proceeds for the period between dump and read.

In the FIG. 1 embodiment, every site on the array under a row gate is at the row bias potential (VRB) except when the row is being dumped or read out. When the row is being dumped, the row bias source is disconnected, and any integrated charge is removed by application of the dump potential which injects the stored charge into the substrate after which the row bias source is reconnected and integration is reinstituted. When the row is being read out, the row bias is again released, and the integrated charge is removed by application of the read potential, which causes a flow of signal charge via the input of the column video processors. Maintaining an integrating bias voltage on the MIS (metal-insulator-semiconductor) sites for a prescribed period between dumping and reading sustains the integration of optionally induced charges for the prescribed period by maintaining the potential well under the row gates. The bias voltage also serves to keep the interface states and traps filled to avoid the inhibiting effect on rapid charge transfer between row and column gates.

The bias voltage need not be uninterrupted at a site between dumping and reading to sustain the integration process. It may be sustained (and not interrupted) at the row gates, as contemplated in the FIG. 1 embodiment, or it may be intermittently applied at the pixel rate, or at any arbitrary rate sufficient to sustain the potential wells. These potential wells, which are of limited capacity, gradually fill and thus "disappear" in the presence of charge integrating from a variety of causes, including the incident IR flux. The rate of intermittent application of the bias should be great enough to prevent "filling" or the introduction of non-linearity into the integration process.

Figure 4:
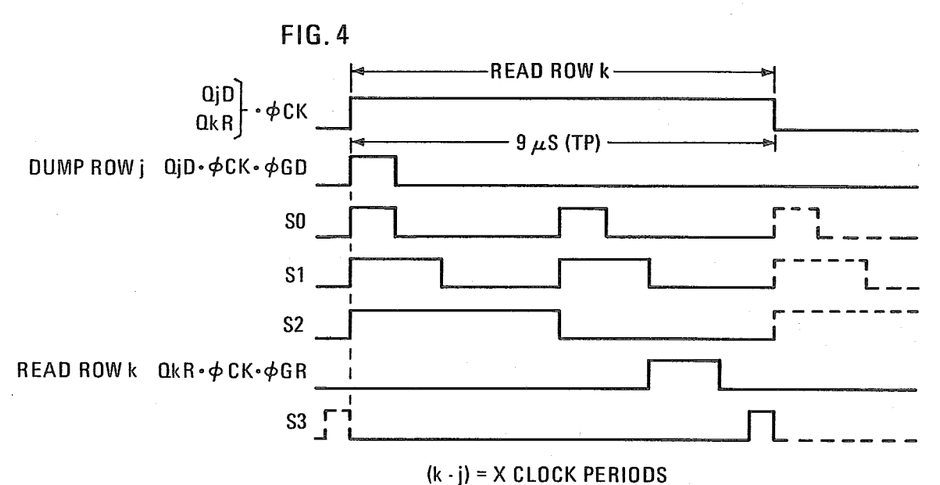
FIG. 4 illustrates the waveforms applicable to the individual column video processors of the FIG. 1 embodiment.

Consistently with the biasing of the row gates, a column bias potential is applied to sustain integration at every column gate. Here the column bias potential is recurrently applied at twice the pixel rate. The waveform SO in FIG. 4 illustrates the twice per pixel time interval at which the switch SO, which is in series with the bias source VCD, is closed to "reset" the column sites (nodes $N1_{1-n}$).

The readout occurs simultaneously for all sites in the row selected for readout. The column selection of a site is achieved via the n fold plurality of odd and even column video processors (CVP$_{l-n}$) and the parallel-to-serial multiplexer (MUX) to which they are connected. Each video processor, after the signal has been obtained, holds the signal at the output nodes (N5$_{l-n}$) for readout by the parallel-to-serial multiplexer. The multiplexer (MUX) then scans the n-fold column video processors (CVP$_{l-n}$) at a sufficiently high rate to obtain signals from all the video processers before a new row is selected by the shift register.

The readout, which proceeds in the manner described in said copending U.S. application Ser. No. 919,464 entails the taking of two "correlated double samples" from a site at a selected row and column, and all four samples are taken during the pixel interval (9 microseconds in FIG. 2). In the cited readout, the readout period of a pixel (tp) requires two equal periods, the first period to obtain the subtractive error by double sampling and the second period to obtain the output signal also by double sampling corrected for subtractive error.

The charge integration process, during the interval between the taking of the first and second of a pair of samples, proceeds in a sense to lessen the voltage change measured and to lessen the signal indication and thus produces the "subtractive error". The subtractive error is the difference between a "true" non-offset first sample and the "actual" or offset first sample. The subtractive error could of course be reduced if the interval between samples (ts) could be reduced. However, the separation between sampling times is set by the injection time and the settling times of the column video processor and is already of minimal duration consistent with other circuit limitations. Thus the error is significant and must be corrected to achieve optimum circuit sensitivity.

The column video processors, whose circuits are as illustrated in FIG. 3, accordingly provide for subtractive error correction in processing the video signal. The timing waveforms relevant to this operation are provided in FIG. 4. A pixel period allocated for dump of row j and read of row k is illustrated as the top waveform.

The dumping waveform (QjD.$\phi$CK.$\phi$GD) appears as the second waveform to the right of the caption "Dump Row j". It is assumed that X clock periods intervene betweem the dump and the read pulses on the same row, X being equal to (k−j). The dump waveform coincides with the waveform (SO) allocated to periodically resetting the column lines to the column bias potential. Readout of the (i,j)th pixel involves selection of the ith row by the read register (SR) and application of read potentials to cause signal injection and charge transfer to the column gate, and the selection of the column video processor (CVP$_j$) for sampling of the transferred signal charge by the multiplexer.

The beginning of column reset waveform (SO) defines the start of readout of the selected pixel. (As noted above, waveform SO is coincident with the dumping waveform.) The subtractive error correction period begins as waveform SO, which defines the period that switch SO is closed, goes high. Waveform SO gies high at the same instant as waveform S1, which defines when switch S1 is closed, and also goes high at the same instant as waveform S2, which defines when switch S2 is closed. The first sample from the column site is thus "taken" after reset by switch SO to the voltage of source VCB, and as switch S1 opens leaving capacitor C1 charged. However, switch S2 continues to remain closed as capacitor C2 charges. When switch S2 opens toward the end of the first half of the pixel period, a charge is left on capacitor C2, representing the second sample, and since no signal injection has taken place reflecting the subtractive error accummulated between the first two samples.

At the beginning of the second half period of the readout, switches S0 and S1 again close to initiate the signal sampling period. When switch S1 reopens, reset siwtch S0 having earlier opened a new first sample (or the third sample) is taken of the voltage on the column line and stored on C1. The read potential is now applied from the row scanner to sites on row k, as shown by the second waveform from the bottom in FIG. 4. Injection then takes place coupling a signal current into the column video processors via nodes N1, N2 and N3. A moment later, waveform S3 goes high, closing switch S3 for taking the final sample. Closure of switch S3 allows capacitor C3 to be charged at node N4 to a value representative of the signal. At the instant that switch S3 (opens at the end of the pixel period), the taking of the fourth sample is complete, and the charge on capacitor C3 now represents a signal sample reset by the charge on capacitor C1, and corrected for subtractive error by the charge on capacitor C2. The charge on capacitor C2 is stored on C3 and is available at the node N5 for sampling by the multiplexer MUX.

The adjustment of the integration time of the charge injection device is achieved in the integration timing control (ITC). This control is accessible to the user of the CID imager so that he may make the optimum adjustment from the point of view of the use he wishes to make of the scene which the imager reproduces. The control entails means for adjusting the delay in integral clock periods between the waveform $\phi$SD and $\phi$SR. A practical realization of this control entails a single shift register having the number of stages equal to the count that it takes to complete the row counting sequence, and clocked by the clocking waveform. The shift register is started by the dump waveform ($\phi$SD), and the read waveform appears at the output of the stage selected by the user to provide the appropriate delay. If the last stage of the shift register is selected, the integration time is maximum and if an output stage at the first stage of the shift register is selected, the integration time is minimum.

The arrangement described above permits integration control from as short as two clock periods to as long as 127 clock periods in the 128 element linear array. In the latter case, the integration time is equal to the "revisit" time, the period required to scan the array. Very short integration times (less than 2 clock periods) can be achieved by double injection during the same clock period. One way to implement this is set the start dump and the start read pulses to occur at the same clock pulse ($\phi$SD=$\phi$SR). The dump pulse for row j now occurs during the same clock period as the read pulse for row j. The dump pulse occurs during the first S0 pulse while the read operation occurs during the second half of the clock period. The integration time is now the time between the end of the dump pulse and the end of the second waveform S1.

For extremely short integration time, (the order of a microsecond), the double injection integration control can be implemented by causing the dump pulse to occur at the beginning of the second half of the pixel period (during S0). The integration time is the time between the end of the dump pulse where the potential well is established and when the first sample occurs, S1 terminates. For the last implementation, the subtractive error subtraction circuit is disabled.

This integration time can be further adjusted by changing the clock period. The adjustment does not entail a change in the timing in relation to the clock, but rather a change in the duration of the clock period. When the clock period is varied, the time interval between two waveforms referenced to the clock varies proportionately. In other words, the waveforms are scaled in time.

Double inject integration control may also be achieved by disabling $\phi$SD altogether, and adding another pulse to the $\phi$GR waveform, which occurs during the first high of the waveform S0. (See FIG. 4.) The added pulse in $\phi$GR waveform (see FIG. 2), may then be adjusted to a later instant within the clocking pulse to shorten the time interval until the taking of the first sample, and thereby shortening the integration period.

The need for these additional adjustments may arise when a very short integration time is sought, as for instance a reduction to a microsecond.

A third method of achieving integration control applicable either to the area or linear array is to cause the array to be coarsely scanned without use of a dump waveform. In the area array two adjacent rows (an odd and an even row) or more are addressed simultaneously and the output of two adjacent columns are combined. This arrangement is implemented using identical pulses on the even scanner and on the odd scanners. The resulting coarse scan (2×2) can now scan the entire array in a half of the time taken for the normal scan. The result is to reduce the integration time in half, assuming that the integration time equals the scanning period. The latter integration time can be halved by doubling the clock rates of both the row and column pulses to give an integration time of one-quarter the normal value.

Figure 5:
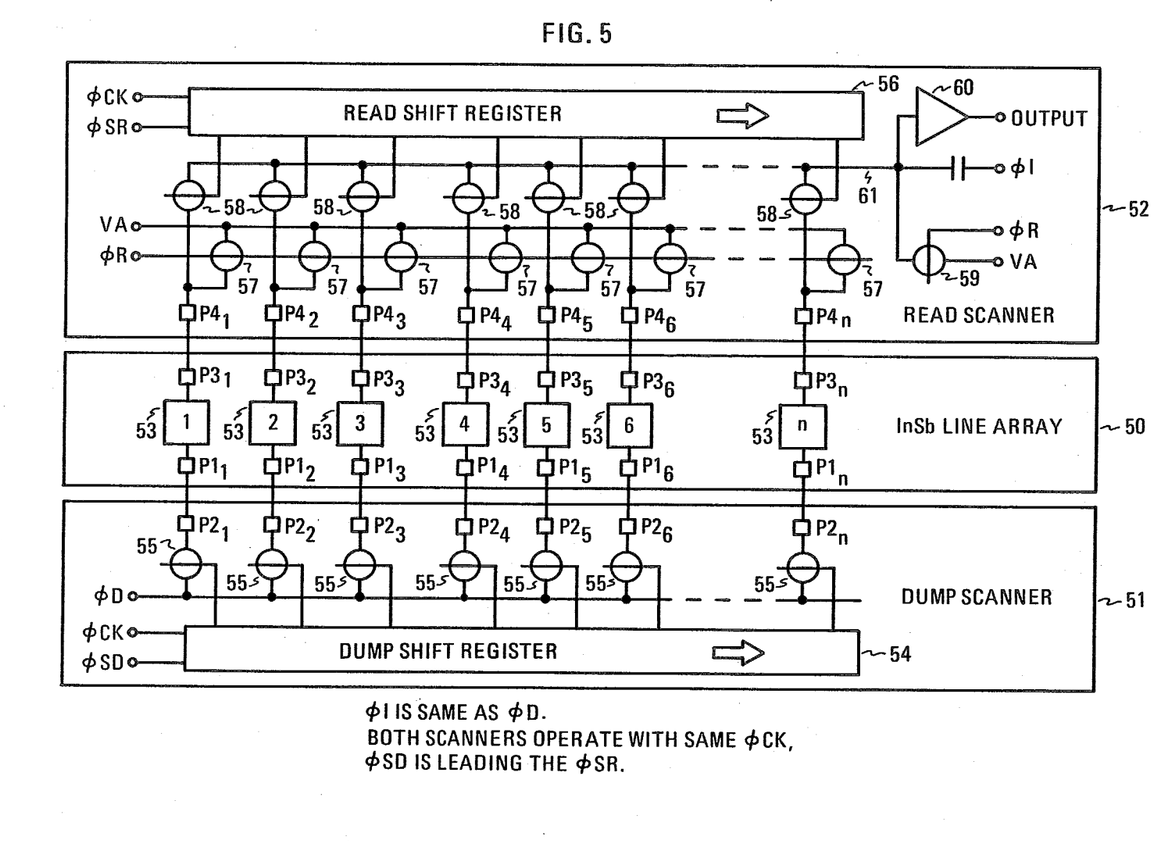
FIG. 5 is an illustration of a second embodiment of the invention combining a radiation sensing charge injection device (CID) comprising a linear array of sensing sites on a semiconducting substrate and a novel readout circuit in which the integration time may be selected to suit the application and incident radiation conditions.
Figure 6:
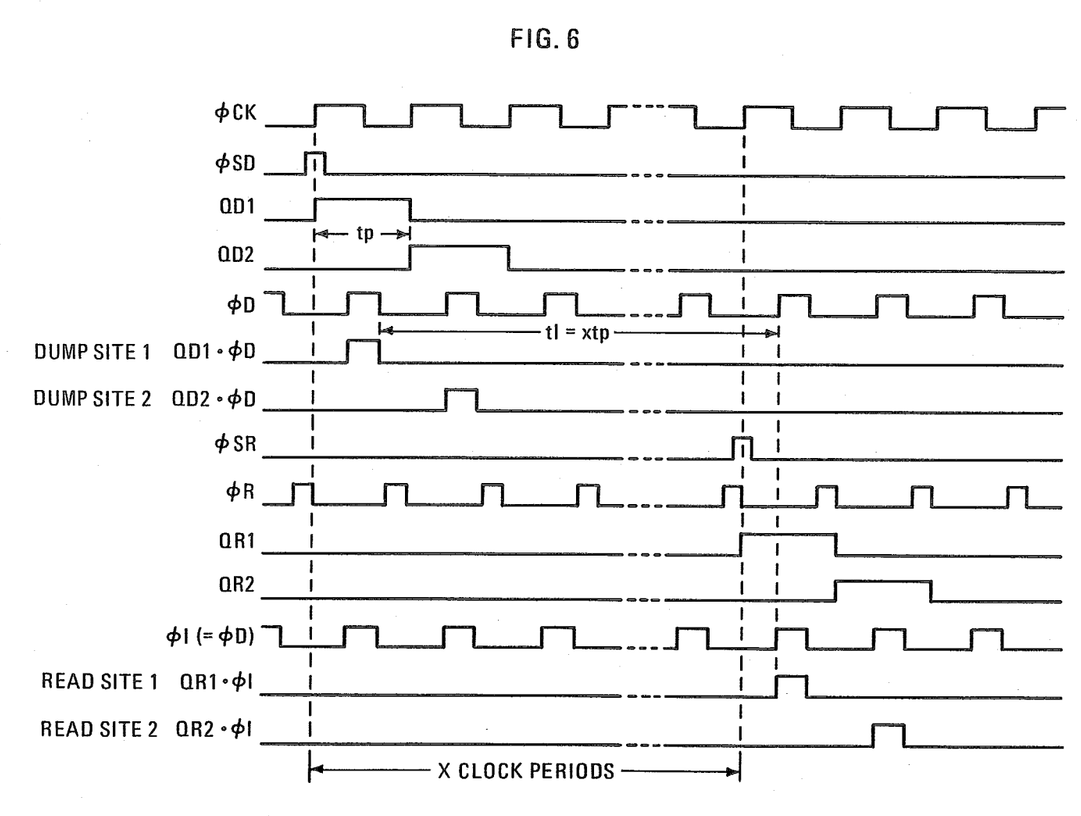
FIG. 6 are the waveforms applicable to the scanner of the readout circuit of the second embodiment.

FIG. 5 illustrates a second embodiment of the invention in which a linear CID imager is shown, modified in accordance with the invention for integration time control. FIG. 6 illustrates the waveforms applicable to operation of the second embodiment. The CID imager comprises three integrated circuits supported upon a common substrate (not illustrated); the line sensor 50, the dump scanner 51, and the read scanner 52. The line sensor 50, is centrally supported upon the common substrate for convenient interconnection with a dump scanner 51 shown arranged below the line array and with the read scanner 52 shown arranged above the line array. The sensor array includes an N-fold plurality of pixel sites 53, each of which are two terminal devices, with one terminal connected to the underlying semiconductor material and a second terminal to the overlying insulated gate metallization. The gate metallization is then connected to a first pad P1 for connection to a corresponding pad P2 on the dump scanner and to a second pad P3 for connection to a corresponding pad P4 on the read scanner.

The dump scanner consists of an N stage shift register 54 and an N-fold plurality of gates 55, each controlled by an output tap from the shift register 54. The dump pulse $\phi$D, which is a periodic pulse at the clock registration rate, the fifth waveform from the top in FIG. 6 is coupled to one principal electrode of the associated gate, and the other principal electrode is coupled to the associated pad P2. The "start" dump pulse $\phi$SD, second from the top in FIG. 6 is coupled to the data input of the shift register 54. Since the shift register 54 is clocked by the clocking waveform, $\phi$CK (the first waveform in FIG. 6), the "start" dump pulse is shifted down the shift register output taps, one clock pulse at a time. The shift register output pulse QDK is a pulse equal in duration to the high of the clocking pulse. Accordingly, as a "high" from $\phi$SD propagates down the dump shift register one gate after the other of the gates 55 open, allowing the dump pulse $\phi$D to cause the removal of stored charge from sequentially selected sites. The dump scanner produces an output at site K when both QDK and $\phi$D go high.

The read scanner consists of an n stage shift register 56, an n fold plurality of bias gates 57, an n fold plurality of signal injection gates 58, a capacitively coupled injection input terminal ($\phi$I), a signal bias reset gate 59, an output amplifier 60, and a CID sensor output terminal. The input waveforms include the clock $\phi$CK, applied to the read shift register, the read "start" pulse $\phi$SR (the eighth waveform from the top in FIG. 6); the bias gating pulse $\phi$R, not shown, repeats at the clock rate and resets the pixel 53 and the sense line 61 and the signal injection pulse $\phi$I. The dc voltages include the bias voltage VB and the amplifier reset voltage VA.

The read scanner sequentially reads the state of each pixel site. The read start pulse $\phi$SR causes a logical one to propagates down the shift register 56 advancing one output tap per clock pulse under the control of the clock $\phi$CK similarly to the dump scanner. The sites are reset at every clock pulse to the bias voltage VB by means of the bias gates 57, which open when the bias gating pulse $\phi$R goes high. The recurrent resetting maintains the potential wells of all the sites throughout the integration period. The readout occurs as the start and a logical high propagates down the shift register 56, producing a high at a predetermined tap, which opens the corresponding gate 58. The site on the sensor is then coupled via the gate 58 to the sense line 61. In the readout process, sense line 61 is first reset to the voltage VA, under control of waveform $\phi$R, and then the injection pulse $\phi$I is applied, timed to inject the charge stored at the pixel site into the substrate, and create a voltage change at the input of the video amplifier 60 coupled to the sense line 61. The operation of the read scanner is as described in U.S. patent application Ser. No. 811,474, and sequential outputs are produced as each pixel site is read out.

In accordance with the invention, the signal which the read scanner reads out, is allowed to integrate at the pixel site by an amount dependent upon the time difference between the start dump waveform and the start read waveform. If the two waveforms are two clock periods apart (dump being first) the integration time is two clock periods, appropriate for a very strong signal. If the start dump pulse is 64 clock periods earlier, assuming a linear array of 128 sites, a half reduction in integration time is provided corresponding to a moderate signal. If the start dump pulse starts 127 clock periods earlier, this is a setting for maximum sensitivity.

What is claimed is:
1. In an IR sensitive charge injection device (CID), the combination comprising:
(A) an array comprising a substrate of IR sensitive semiconductor material supporting an interfacing layer of insulating material and on which rows by n columns of pixel sites forming charge storing potential wells are arranged, each site having a conductive row gate and a conductive column gate, the charges at a site being free to flow at the interface between the column gate and row gate in the presence of a bias potential, the row gates for each row of sites being interconnected by a conductive row line and the column gates for each column of sites being interconnected by a conductive column line, (B) a readout circuit comprising:
   (a) means including a source (VRB) of row bias potentials and m controllable row bias reset switches ($RS_{l-m}$), for establishing said charge storing potential wells at the row gate cells and for facilitating charge exchange between column and row gates at a site,
   (b) a source (VRD) of row dump potentials suitable for injecting signal charge into the substrate and m controllable row dump switches ($DS_{l-m}$), each dump switch being connected to couple the dump potential to an associated row site,
   (c) a source (VRR) of row read potentials suitable for injecting signal charge into the substrate and transferring charge via the column line during readout, and m controllable row switches ($TS_{l-m}$), each row read switch being connected to couple the read potential to an associated row site,
   (d) means including a clock rate $\phi CK$ to establish equal charge integration times for all sites comprising
      (1) means including a first m stage shift register (SRD) for propagating at a said clock rate $\phi CK$, a given logical state starting in response to a dump start pulse ($\phi SD$) recurring at the interval required to sequentially scan said m sites, connected to said means B(b) for sequentially dumping each site when said given logical state occurs and clocked at a given clock rate to produce sequential dump outputs ($QD_{l-m}$) having the duration of a clock period,
      (2) means including a second m stage shift register (SRR) for propagating at said clock rate $\phi CK$, a given logical state starting in response to a read start pulse ($\phi SR$) recurring at the interval required to sequentially scan said m sites, connected to said means B(c) for sequentially reading out each site when the last recited logical state occurs, and clocked at said given clock rate to produce sequential read outputs ($Q_{Rl-m}$) having the duration of a clock period,
      (3) m fold means for ANDing/$\phi CK$ and $QD_i$ to obtain a sequence of single pulses for each row of the duration of the clock pulse highs ($QD_i.\phi CK$),
      (4) m fold means for ANDing $\phi CK$ and $QR_{l-m}$ to obtain a single pulse in the scanning sequence for each row of the duration of said clock pulse highs ($QR_i.\phi CK$), and which lag said dump pulses at each pixel by an integral number of clock pulses,
      (5) a source of periodic short, dump gate pulses ($\phi GD$) at the clock repetition rate,
      (6) a source of periodic short, read gate pulses ($\phi GR$) at the clock repetition rate,
      (7) m fold means to AND ($QD_i.\phi CK$) and ($\phi GD$) to obtain a short dump pulse for each row ($QD_i.\phi CK.\phi GD$), the output thereof being coupled to means B(b) for dumping,
      (8) m fold means to AND ($QD_i.\phi CK$) and ($\phi GR$) to obtain a short read pulse for each row, ($QR_i.\phi CK.\phi GR$) delayed an integral number of clock pulses from the dump pulse for that row, the output thereof being coupled to means B(c), for readout,
      (9) m fold means for ORing the outputs of means B(d)(8) or B(d)(7) coupled to said means B(a) for disconnecting a row line from said source (VRB), when either dumping or readout is occurring,
      (10) timing means providing said dump start pulses $\phi SD$ and said read start pulses $\phi SR$, said read start pulses being delayed in relation to said dump start pulses by a predetermined portion of the scanning interval required to sequentially scan m sites to establish a desired and equal integration time for each site.

2. The combination set forth in claim 1 having in addition thereto
   (e) an n fold plurality of column video processors, each processor comprising:
      (1) a gain amplifier having the input thereof coupled to a column line,
      (2) means including a source (VCB) of column bias potentials and a controllable column bias reset switch ($S0_j$), for applying a column bias potential (VCB) to said column line for establishing said charge storing potential wells at the column cells, and for facilitating charge exchange between column and row gates at a site,
      (3) and a correlated double sampling circuit coupled to the output of said amplifier, and
   (f) demultiplexing means coupled to the outputs of said n fold column video processors to consolidate the readout of said m × n pixel sites into a suitable format for subsequent utilization.

3. The combination set forth in claim 1 having in addition thereto
   (e) n column video processors each comprising double sampling means operable at the beginning and end of a first interval, without injection, to sample and hold a first electrical quantity for each site dependent on the change in IR induced charge in the column line representing subtractive error, said first interval constituting one half of the period for site readout,
   said double sampling means being operable at the beginning and end of a second interval, with injection, said second interval being equal to said first interval, to sample and hold a second electrical quantity for each site dependent on the IR induced charge accumulated over the integration time and increased by said first quantity to correct for subtractive error, and
   wherein said timing means (d)(4) further comprises
   means to obtain shorter integration times than the period for site readout, operable when said dump start pulse and said read start pulse are selected to occur during the same clock period, the dump start waveform, which starts integration, being timed to occur prior to the taking of one of the first samples in the first and second intervals, integration terminating upon the taking of the first sample in said second interval, causing the integration time to be optionally slightly over one half the site readout period, or a fraction of the site readout period.

4. The combination set forth in claim 1 having in addition thereto output demultiplexing means, and n column video processors, with odd column video processors and even column video processors being simultaneously sampled, by said output demultiplexing means, and wherein said first m stage shift register (SRD) is partitioned into two registers, one for even and the other for odd rows, said second m stage shift register (SRR) is partitioned into two registers, one for even and one for odd rows, and wherein said odd registers provide for dump and read operation during a logical high at the first half of the clock waveform, and said even registers provide for dump and readout operation during a logical low at the second half of said clock waveform, and wherein said timing means (d) further comprises means to selectively activate both odd and even registers simultaneously and both odd and even column video processors simultaneously to produce a coarse scan in which four sites are read out at a time, causing the integration time between dump and read pulses to be divided by two.

5. The combination set forth in claim 4 wherein said timing means (d) further comprises means to selectively double the clock rate causing the integration time between dump and read pulses to be divided by four.

* * * * *